US008669687B2

(12) United States Patent
Carpentier et al.

(10) Patent No.: US 8,669,687 B2
(45) Date of Patent: Mar. 11, 2014

(54) METHOD OF ADJUSTING THE RESONANCE FREQUENCY OF A MICRO-MACHINED VIBRATING ELEMENT

(75) Inventors: Jean-Francois Carpentier, Grenoble (FR); Fabrice Casset, Tencin (FR); Yoan Civet, La Murette (FR); Skandar Basrour, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 25 days.

(21) Appl. No.: 13/436,262

(22) Filed: Mar. 30, 2012

(65) Prior Publication Data
US 2012/0248932 A1   Oct. 4, 2012

(30) Foreign Application Priority Data
Mar. 31, 2011 (FR) ...................... 11 52729

(51) Int. Cl.
*H01L 41/08* (2006.01)
(52) U.S. Cl.
USPC .......................... 310/312; 310/369
(58) Field of Classification Search
USPC ......................................... 310/312
See application file for complete search history.

(56) References Cited

U.S. PATENT DOCUMENTS

| 7,170,369 | B2 * | 1/2007 | Huang et al. | 333/186 |
| 7,196,452 | B2 * | 3/2007 | Wadaka et al. | 310/312 |
| 7,307,496 | B2 * | 12/2007 | Huang et al. | 333/186 |
| 7,675,389 | B2 * | 3/2010 | Yamakawa et al. | 333/133 |
| 2002/0074897 | A1 | 6/2002 | Ma et al. | |
| 2002/0158702 | A1 * | 10/2002 | Tikka et al. | 332/100 |
| 2005/0242904 | A1 | 11/2005 | Lutz et al. | |
| 2007/0139140 | A1 * | 6/2007 | Rao et al. | 333/188 |
| 2010/0019869 | A1 | 1/2010 | Durand et al. | |

FOREIGN PATENT DOCUMENTS

WO   2010-061479  A1   6/2010

OTHER PUBLICATIONS

Abdelmoneum, M.A., et al., "Location-Dependent Frequency Tuning of Vibrating Micromechanical Resonators Via Laser Trimming," IEEE International Ultrasonics, Ferroelectrics, and Frequency Control Joint 50th Anniversary Conference, Aug. 23, 2004, pp. 272-279.
Hsu, W.-T., et al. "Frequency Trimming for MEMS Resonator Oscillators," Frequency Control Symposium 2007, Joint with the 21st European Frequency and Time Forum, May 1, 2007, pp. 1088-1091.
Joachim, E., et al., "Characterization for Selective Polysilicon Deposition for MEMS Resonator Tuning," IEEE Journal of Microelectromechanical Systems, vol. 12, No. 2, : Apr. 1, 2003, pp. 192-200.

* cited by examiner

*Primary Examiner* — Mark Budd
(74) *Attorney, Agent, or Firm* — Seed IP Law Group PLLC

(57) ABSTRACT

The present disclosure relates to a method of adjusting the resonance frequency of a vibrating element, comprising measuring the resonance frequency of the vibrating element, determining, using abacuses and as a function of the resonance frequency measured, a dimension and a position of at least one area of modified thickness to be formed on the vibrating element so that the resonance frequency thereof corresponds to a setpoint frequency, and forming on the vibrating element, an area of modified thickness of the determined dimension and position.

21 Claims, 7 Drawing Sheets

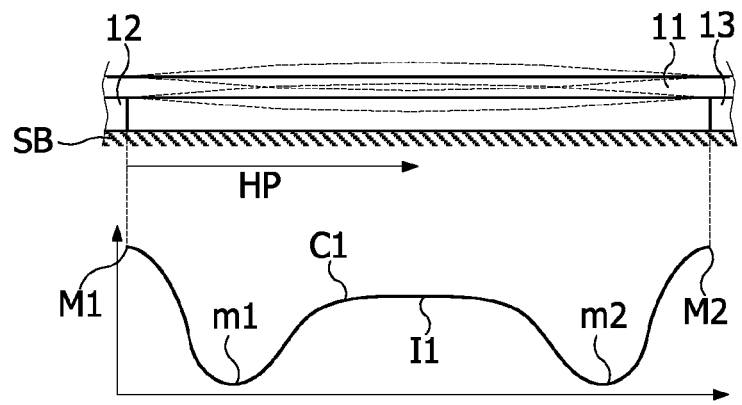
Fig. 2A
Fig. 2B
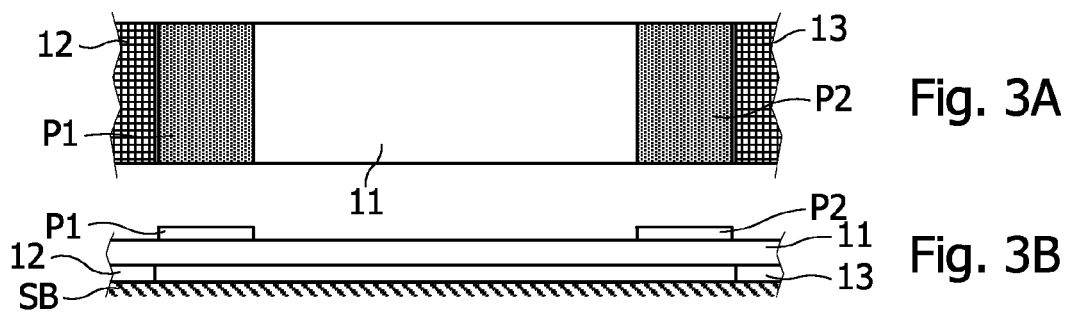
Fig. 3A
Fig. 3B
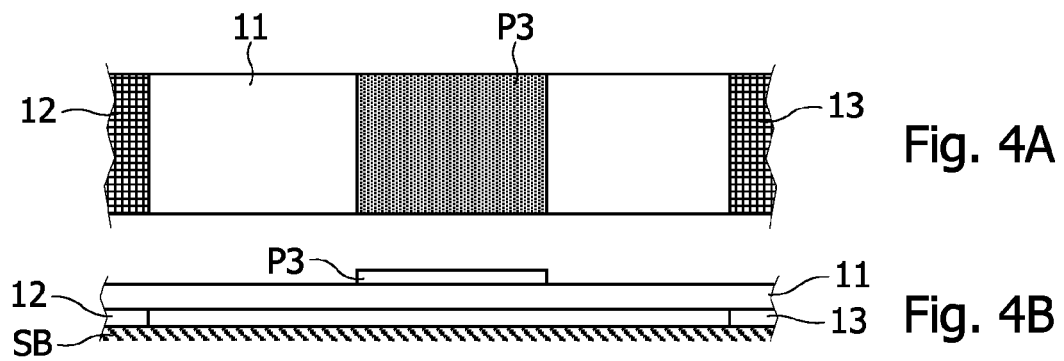
Fig. 4A
Fig. 4B
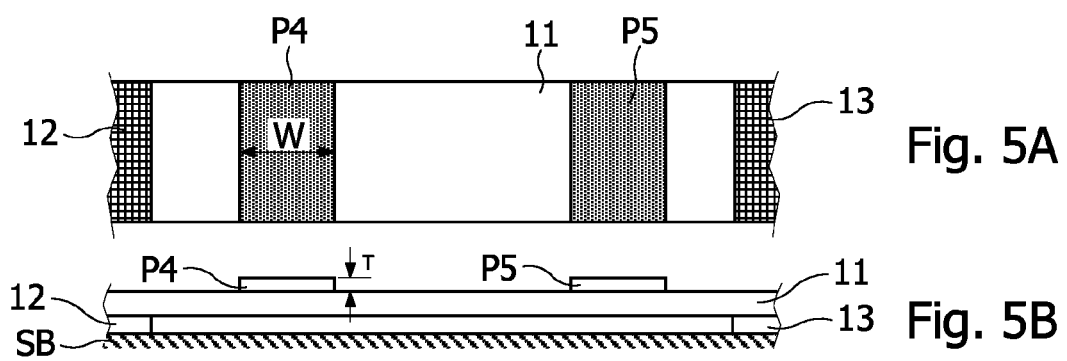
Fig. 5A
Fig. 5B

METHOD OF ADJUSTING THE RESONANCE FREQUENCY OF A MICRO-MACHINED VIBRATING ELEMENT

BACKGROUND

1. Technical Field

The present invention relates to micro-machined vibrating elements located in some electromechanical components such as resonators, motion sensors (accelerometers, rate gyros, and the like) and vibration sensors. The present invention applies in particular to the manufacture of such components.

2. Description of the Related Art

Nowadays, electromechanical components with vibrating element(s) are particularly provided on numerous portable devices, such as mobile phones, and other mobile communication terminals. It is therefore wished to miniaturize these components. In addition, electromechanical resonators tend to replace quartz resonators in electronic circuits, in particular due to the high frequencies they can reach, their lower electrical consumption and their ability to be integrated with other circuits on a semiconductor substrate.

Electromechanical components with a vibrating element generally comprise an electrode for detecting actuating movement of the vibrating element. The vibrating element has a specific resonance frequency linked to its dimensions, to the way it is supported, and to the elastic properties of the material of which it is made and to the way it is actuated. The resonance frequency Fr of a vibrating element may be determined by the following equation:

$$Fr = \frac{1}{2\pi}\sqrt{\frac{k}{m}} \quad (1)$$

where m is the mass of the vibrating element and k its stiffness.

According to the application, the vibrating element may have various shapes such as that of a beam or a rectangular plate maintained by one or more ends, or a disc maintained by one to four or more points distributed on its periphery. They can vibrate according to a flexion or volume mode. Such vibrating elements may be made by depositing onto a support, for example a silicon wafer, a layer of a sacrificial material, then a layer of the material desired for the vibrating element going beyond the sacrificial layer. The layer in the material constituting the vibrating element is then cut according to the outlines thereof, for example by photo-etching, keeping links between the vibrating element and the support, and the sacrificial layer is removed for example by plasma etching. The vibrating element is thus only maintained by its links to the support, and is therefore free to vibrate. Such vibrating elements may thus be collectively manufactured on silicon wafers.

FIGS. 1A, 1B and 1C schematically show an example of resonator. FIG. 1A is a partial, schematic top view of the resonator. FIGS. 1B and 1C are cross-sectional views along planes B-B and C-C, respectively. The resonator comprises a vibrating element 1, for example in the shape of a bar of rectangular shape and cross-section. The element 1 is fixed by arms 2 to anchor areas 3. The arms 2 are arranged along a center line 5 of the element 1. The element 1 is surrounded by an empty area 6 and electrodes 4 symmetrically arranged in relation to the line 5.

In FIGS. 1B and 1C, the element 1, the arms 2 and the anchors 3 are formed in a thin layer, for example in single-crystal or poly-crystal silicon, on a support 10, for example consisting of a silicon wafer. An empty area 6' located between the support 10 and the element 1 results from the partial removal of a sacrificial layer 7.

During operation, the element 1, at least partially made of a conductive material, is subjected to a first potential and the electrodes 4 are subjected to a second potential. The difference between the first potential and the second potential creates an electrostatic force tending to cause a distortion of the element 1. The element 1 then begins to oscillate at its resonance frequency around the line 5 in the case of a vibration in the plane of FIG. 1A. The distortion of the element 1 causes a capacitance variation between the element 1 and the electrodes 4, this variation may be detected on one of the two electrodes 4.

Due in particular to the effects of miniaturization and manufacturing process, differences of resonance frequency may be observed between vibrating elements assumed to be identical, collectively formed on a same silicon wafer. Thus, differences in resonance frequencies of +/−1000 parts per million (ppm) ($10^{-4}$%) n relation to a target resonance frequency, may be observed between the vibrating elements formed on a same wafer. These differences may be observed in particular between vibrating elements formed near the center of a wafer and those formed near the edge of the wafer. These differences may result from variations of parameters of photo-etching processes, which introduce differences of widths, lengths, and/or thicknesses of the vibrating elements.

It may be desirable to limit these resonance frequency variations to some ppm, even to values lower than the ppm. Indeed, the applications relating to mobile telephony transmissions, such as Global systems of Mobile Communications (GSM) have a resonance frequency precision around the ppm. Global positioning system (GPS) receivers must have a resonance frequency precision lower than the ppm. Other applications (Ethernet, Bluetooth) require precisions around some dozens of ppm.

It has already been suggested to measure the resonance frequency of vibrating elements collectively formed on a wafer before individualization, so as to discard the elements having a difference with a rated resonance frequency higher than a threshold. However, if the required precision is high, this solution tends to discard a significant part of the resonators formed on a wafer.

BRIEF SUMMARY

Embodiments relate to a method of adjusting the resonance frequency of a vibrating element, comprising: measuring a resonance frequency of the vibrating element, determining using abacuses, and as a function of the resonance frequency measured, dimensions and a position of at least one area of modified thickness, to be formed on the vibrating element so that the resonance frequency of the vibrating element corresponds to a setpoint frequency, and forming on the vibrating element, an area of modified thickness of the determined dimensions and position.

According to an embodiment, each area of modified thickness is made by forming a patch on the vibrating element.

According to an embodiment, forming each patch on the vibrating element is performed by adding a layer of a chosen material, having a determined thickness, and by removing the layer added outside areas where a patch is to be formed.

According to an embodiment, forming the patchs on the wafer is performed by removing from the vibrating element a layer outside areas where a patch is to be formed.

According to an embodiment, the resonance frequency of the vibrating element is increased by forming a patch on the vibrating element on an area where the stress to which the vibrating element in resonance is subjected is maximum.

According to an embodiment, the resonance frequency of the vibrating element is decreased by forming a patch on the vibrating element on an area where the stress to which the vibrating element in resonance is subjected is minimum.

According to an embodiment, the abacuses are obtained by forming areas of modified thicknesses of different dimensions and/or thicknesses on an area of the vibrating element where the stress to which the vibrating element in resonance is subjected is minimum, and by measuring the resonance frequency of the vibrating element, or with analytical or finite element models.

Embodiments also relate to a method of manufacturing electronic components collectively formed on a wafer comprising: forming on the wafer vibrating elements, measuring the resonance frequency of each of the vibrating elements on the wafer, and steps of implementing the previously defined method.

According to an embodiment, the measurements of resonance frequency are taken once for a manufacturing line of electronic components, forming patchs on the wafer being made using a photoetching mask defined from the dimensions and positions of determined patchs.

According to an embodiment, the patchs are formed on the wafer before the vibrating elements.

Embodiments also relate to an electronic component comprising a vibrating element, having a modified resonance frequency implementing the method as previously defined.

According to an embodiment, each patch is made in a material chosen in the group comprising silicon, silicon oxide, silicon nitride, chromium and gold.

According to an embodiment, the vibrating element has the shape of a beam or a plate maintained between two ends, or a disc maintained at the periphery thereof by four points.

According to an embodiment, each patch is made on a face of the vibrating element facing a support on which the component is formed.

BRIEF DESCRIPTION OF THE SEVERAL VIEWS OF THE DRAWINGS

Example embodiments of the invention will be described below in relation with, but not limited to the appended figures wherein:

FIG. 2B shows a curve of the stress to which is subjected the vibrating element of FIG. 2A, FIG. 3A shows in top view a vibrating element, according to another embodiment, FIG. 3B shows in side view the vibrating element of FIG. 3A, FIG. 4A shows in top view a vibrating element, according to another embodiment, FIG. 4B shows in side view the vibrating element of FIG. 4A, FIG. 5A shows in top view a vibrating element, according to one embodiment, FIG. 5B shows in side view the vibrating element of FIG. 5A.

DETAILED DESCRIPTION

Figure 1A:
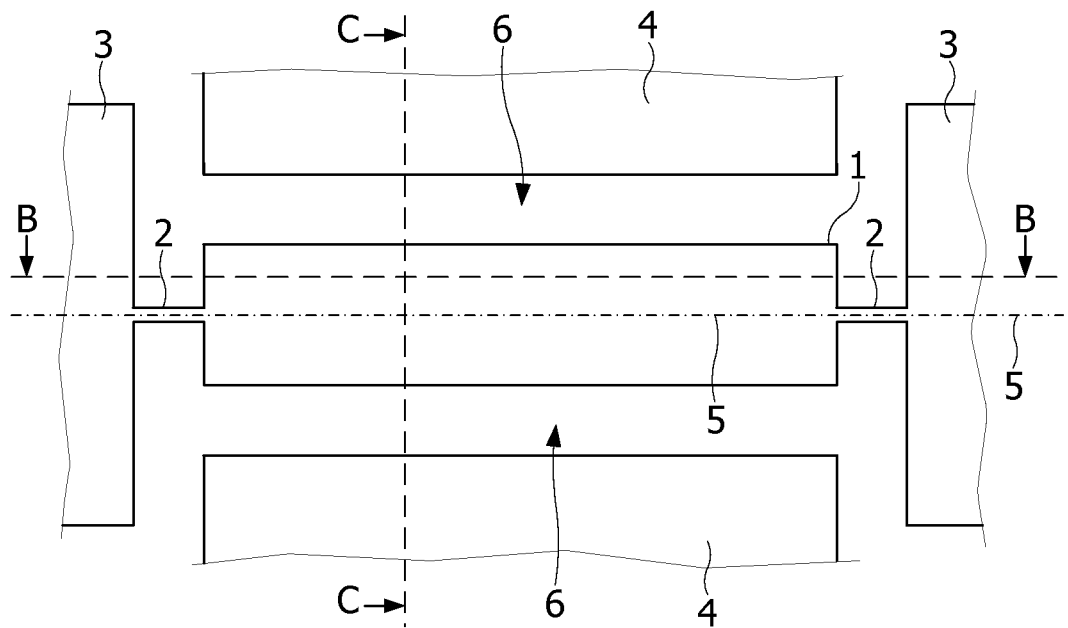
FIG. 1A previously described schematically shows in top view a device comprising a vibrating element according to prior art, FIGS. 1B and 1C previously described are longitudinal and transversal cross-section views of the device of FIG. 1A, FIG. 2A schematically shows in side view a vibrating element in the shape of a beam, susceptible of vibrating in a direction where it has its smaller dimension.
Figure 1B:
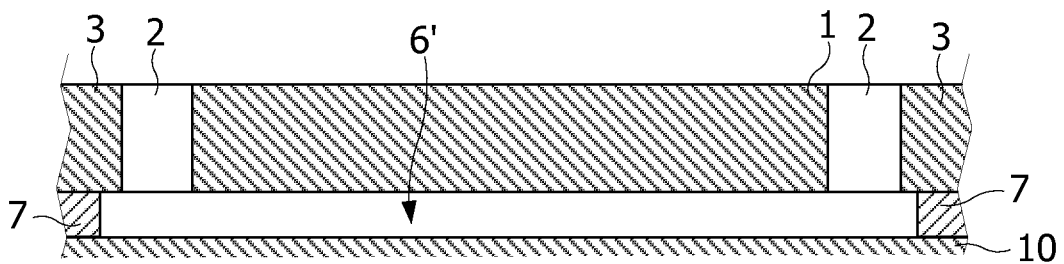
Figure 1C:
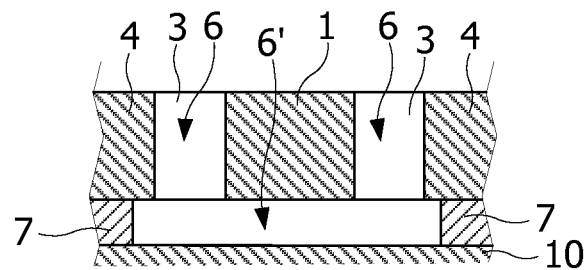

US Patent Publication No. 2010/0019869 offers to form, in the vibrating element, columns in a material having a Young modulus temperature coefficient opposite to that of the material in which the vibrating element is formed. This solution does not allow process corners to be corrected on a same wafer.

FIG. 2A shows a micro-machined vibrating element 11 in the shape of a beam, maintained along two opposite edges by anchor areas 12, 13 formed on a support SB. The element 11 may vibrate in a direction perpendicular to the plane thereof. FIG. 2B shows a curve C1 of the stress to which is subjected the element 11 when it is subjected to a vibration at its resonance frequency. The stress curve C1 has maximum values M1, M2 near fixed points (anchor areas 12, 13) of the element 11, followed by minimum values m1, m2 when going toward the center of the element 11. The minimum values m1, m2 are separated by a central area I1 corresponding to an average stress value.

It has been observed that by arranging a patch on one or more regions of a face of the vibrating element, chosen according to the stress to which these regions are subjected, it is possible to increase or decrease the resonance frequency of the vibrating element. Thus, if a region subjected to a minimum stress is covered by a patch, the mass and stiffness of the vibrating element increase. As stiffness is modified in a low stress region, the modification has little effect on the resonance frequency. Therefore the result of the equation (1) is that the resonance frequency of the vibrating element decreases. On the other hand, if a region of the vibrating element subjected to high stress is covered by a patch, the resulting increase of stiffness of the vibrating element in these regions is going to affect the resonance frequency more that the resulting mass increase. According to the equation (1), the resonance frequency of the vibrating element is therefore going to increase. The resonance frequency variations thus obtained also depend on the thickness of each patch added and on the material of which it is made. Thus, the bigger the thickness of each patch is, the more significant the resonance frequency correction.

FIGS. 3A to 6B show the vibrating element 11 comprising one or two patchs arranged on the upper face thereof, according to various embodiments. In FIGS. 3A, 3B, the patchs P1, P2 are arranged near the anchor areas 12, 13. Thus, according to the curve C1, the patchs P1, P2 cover regions subjected to maximum stress (M1, M2). The result is that the resonance frequency of the element 11 is increased in relation to a same vibrating element not comprising the patchs P1, P2.

In FIGS. 4A, 4B, a patch P3 is arranged near the center of the element 11, i.e., on a region subjected to an average stress value corresponding to the region I1 of the curve C1. The result is that the resonance frequency of the element 11 is increased in relation to a same vibrating element not comprising the patch P3.

In FIGS. 5A, 5B, the patchs P4, P5 are arranged near regions subjected to minimum stress (areas m1, m2 of the curve C1). The resonance frequency of the element 11 is then decreased in relation to a same vibrating element not comprising the patchs P1, P2. This phenomenon is due to an increase of the mass of the element 11 without modifying its stiffness coefficient k in the stressed regions.

Figure 6A:
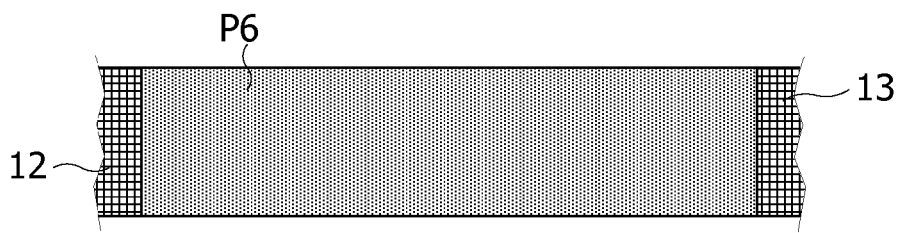
FIG. 6A shows in top view a vibrating element, according to one embodiment.
Figure 6B:
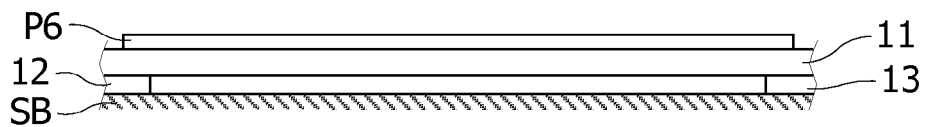
FIG. 6B shows in side view the vibrating element of FIG. 6A.

In FIGS. 6A, 6B, a layer P6 covers all the upper face of the vibrating element 11. According to the curve C1, the vibrating element 11 has a stressed surface larger than its not stressed surface. The result is that the layer P6 will tend to increase the resonance frequency of the element 11.

It may therefore be chosen to increase or decrease the resonance frequency of the element 11 using, for example, a same material.

The patchs P1, P2, P3, P4, P5, P6 may extend across the width of the element 11, as shown in FIGS. 3A, 4A, 5A, 6A, or only on a part of the width, for example centered on a longitudinal center line of the element 11. The patchs may be made of various materials such as Si, Cr, $SiO_2$, $Si_3N_4$, Au, or any other suitable material, which may be chosen according to their densities and mechanical properties, in particular their Young moduli.

Figure 7:
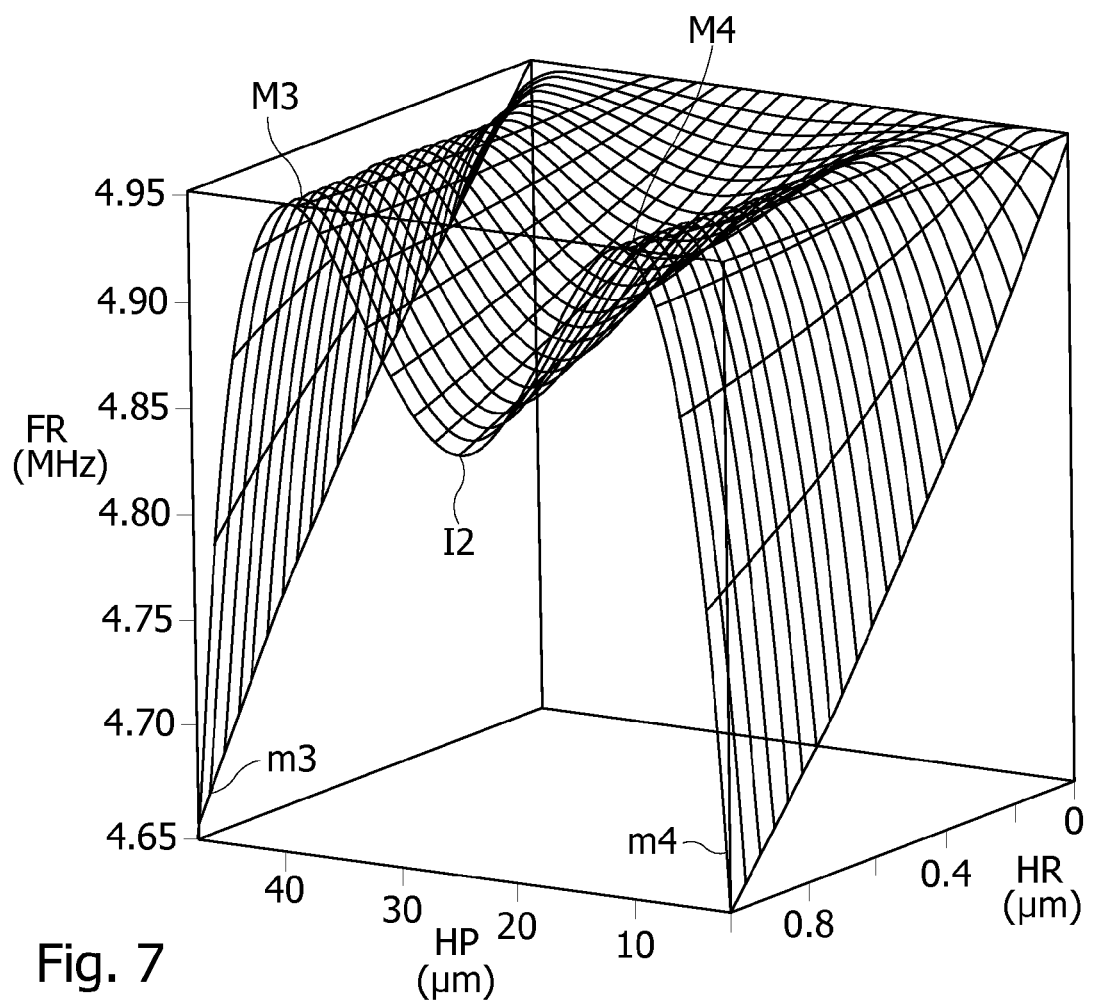
FIG. 7 shows variation curves of the resonance frequency of a vibrating element as a function of the position and radius of a perforation made in the vibrating element.

FIG. 7 shows variation curves of the resonance frequency FR of a vibrating element in the shape of a beam, such as that shown in FIG. 2A, maintained along two opposite edges. The resonance frequency of the vibrating element is modified by forming a perforation in the vibrating element according to an axis perpendicular to the plane thereof. The curves of FIG. 7 are obtained by varying the position HP of the perforation along the vibrating element from a fixed point, for different radius values HR of the perforation. The numerical values shown in FIG. 7 correspond to a vibrating element made of silicon 50 μm long, 20 μm wide and 1.4 μm thick. In these conditions, the resonance frequency of the vibrating element is of 4.95122 MHz. When the position of the perforation varies along the vibrating element, the resonance frequency has minimum values m3, m4 when the perforation is near the fixed edges of the vibrating element, maximum values M3, M4 near the regions m1, m2 (FIGS. 2A, 2B) and an intermediate local minimum value 12 between the values M3, M4 and corresponding to the region I1. The maximum values M3, M4 are slightly higher (around 1,000 ppm or 0.1%) than the resonance frequency of the vibrating element without perforation. The result is that the resonance frequency of the vibrating element may be increased or decreased according to the region of the vibrating element where the perforation is made. The curves of FIG. 7 are inverted (the values M3, M4 become minimum values, and the values m3, m4 and 12 become maximum values) if, instead of forming a perforation, matter is added by forming a patch on the vibrating element.

Figure 8:
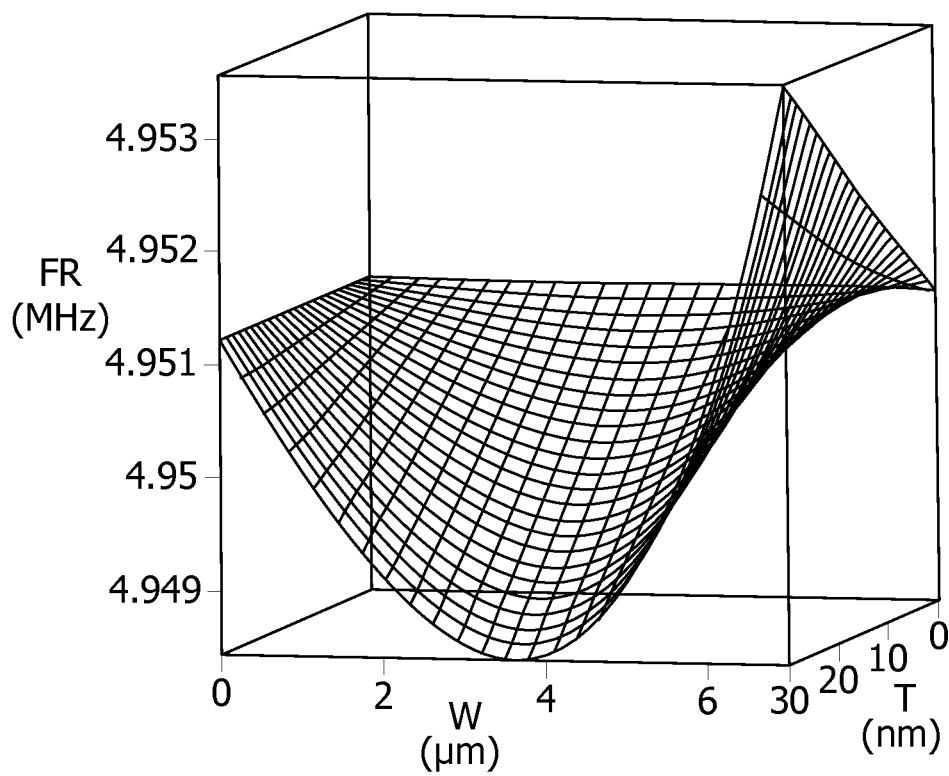
FIG. 8 shows variation curves of the resonance frequency of a vibrating element as a function of the width and thickness of a patch made on the vibrating element.

The differences in resonance frequency, in relation to a rated frequency, exhibited by vibrating elements formed on a same silicon wafer are usually within a range from approximately −1,000 to approximately +1,000 ppm, and depend on the shape and dimensions of the vibrating element. Such differences appear to be totally compatible with the correction possibilities offered by arranging one or more patchs in determined regions of the vibrating element. Thus, FIG. 8 shows variation curves of the resonance frequency FR as a function of the width W, for various thicknesses T of a patch (P4 or P5) arranged on one of the regions m1, m2 of a vibrating element (FIGS. 5A, 5B) having features similar to those subject of the curves of FIG. 7. The curves of FIG. 8 show that the resonance frequency of the vibrating element may be decreased using one or two patchs arranged on the regions m1, m2 of the vibrating element and having a width lower than around 6 μm, and increased if these same patchs have a width higher than 6 μm.

Figure 9:
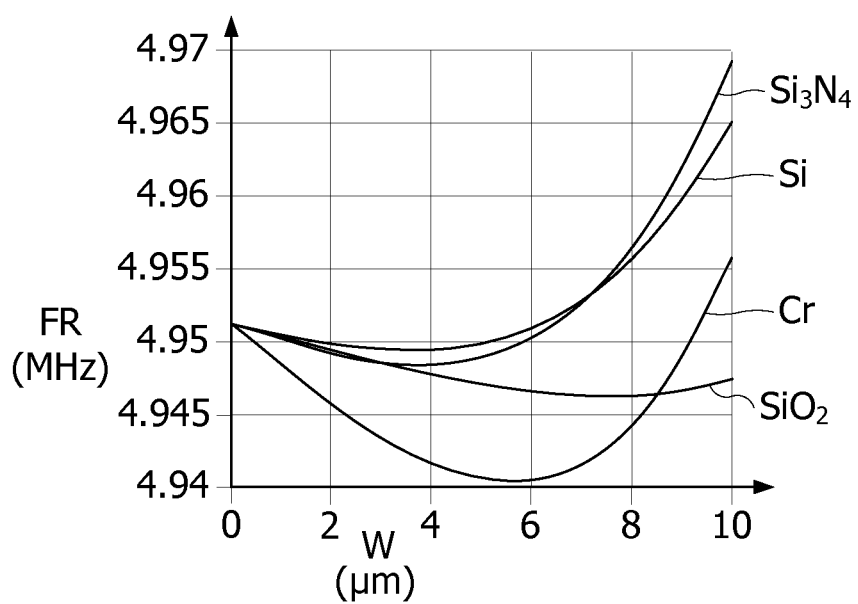
FIG. 9 shows variation curves of the resonance frequency of a vibrating element as a function of the width of a patch made on the vibrating element, for various materials constituting the patch.

FIG. 9 shows variation curves of the resonance frequency FR as a function of the width W of a patch, when this patch has a thickness of 20 nm and is formed on one of the regions m1, m2, in various materials such as silicon (Si), silicon oxide ($SiO_2$), silicon nitride ($Si_3N_4$) and chromium (Cr). The curves of FIG. 9 show that if a significant correction (around 2,000 ppm) for decreasing the resonance frequency is necessary, chromium may be used as the material constituting the patchs.

Figure 10A:
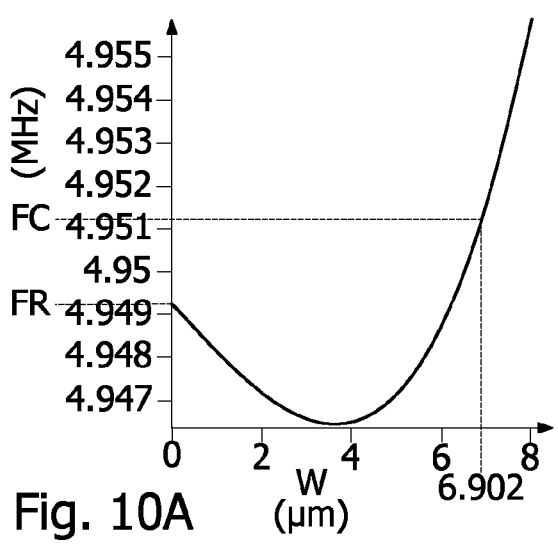
FIGS. 10A, 10B show variation curves of the resonance frequency of vibrating elements as a function of the width of a patch made on the vibrating element.
Figure 10B:
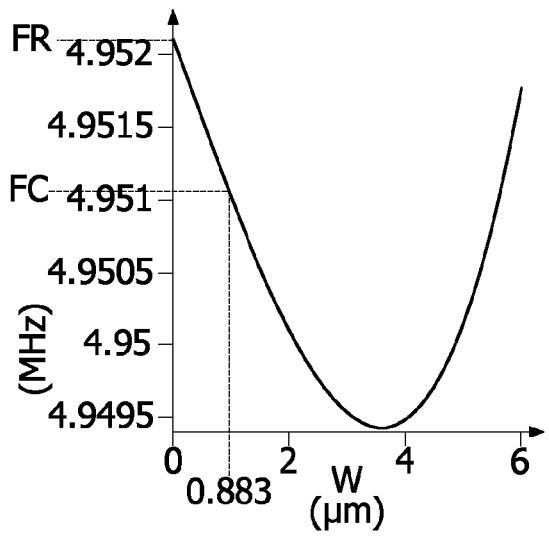

FIGS. 10A, 10B show variation curves of the resonance frequency FR of vibrating elements, as a function of the width W of a patch 30 nm thick (chosen for example according to FIG. 8), arranged on the region m1 and/or m2 of the vibrating element. The curves of FIGS. 10A and 10B may be those of two vibrating elements formed on a same semiconductor wafer. In FIG. 10A, the vibrating element has a resonance frequency of around 4.9492 MHz (at W=0) instead of a setpoint resonance frequency FC of 4.95122 MHz. The frequency correction to be made is therefore of around +2 kHz, i.e., around +400 ppm. According to the curve of FIG. 10A, the frequency FC may be reached with a patch of 6.902 μm.

In FIG. 10B, the vibrating element has a resonance frequency of around 4.9522 MHz instead of the setpoint resonance frequency FC at 4.95122 MHz. The frequency correction to be made is therefore of around −1 kHz, i.e., around −200 ppm. According to the curve of FIG. 10B, the setpoint frequency may be reached with a patch of 0.883 μm. The resolution of the resonance frequency correction of a vibrating element may thus reach 5 ppm with the current photolithography techniques.

Figure 11A:
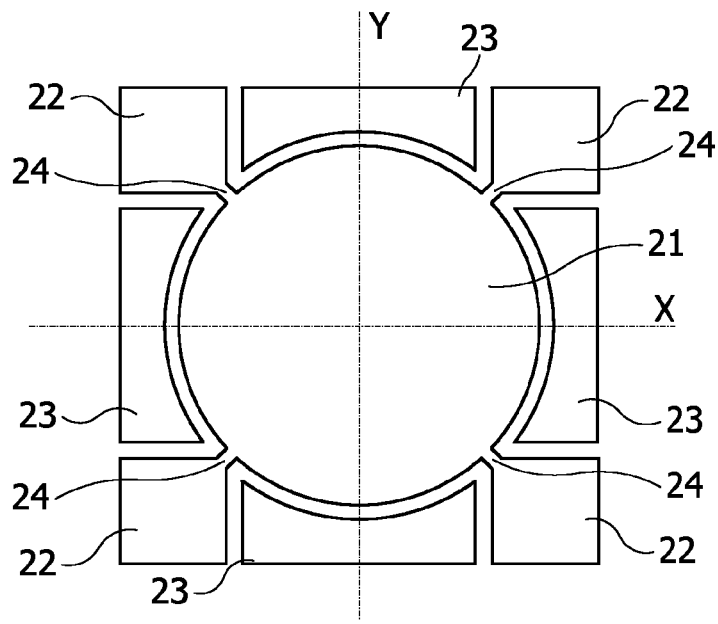
FIGS. 11A, 11B show in top view and cross-section view a vibrating element in the shape of a disc.
Figure 11B:
Figure 11C:
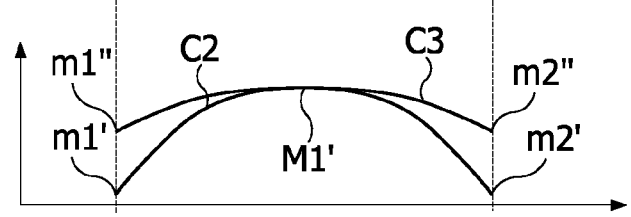
FIG. 11C shows curves of the stress to which is subjected the vibrating element of FIG. 11A, FIGS. 12A, 12B show in top views variations of the vibrating element of FIGS. 11A-11C, according to various embodiments.

FIGS. 11A, 11B show a vibrating element 21 in the shape of a disc linked to a support fixed by four arms 24 which may for example be uniformly distributed at the periphery of the disc. FIG. 11B is a section view along an axis X or Y. The arms are linked to anchor areas 22. Electrodes 23 are formed facing the periphery of the disc between the arms 24 and the anchor areas 22. FIG. 11C shows curves C2, C3 of the stress of the vibrating element 21 subjected to a vibration according to a volume mode called "elliptic" or "wine glass", at the resonance frequency of the element 21. The curve C2 corresponds to the stress to which is subjected the element 21 along the axis X, and the curve C3, to the stress to which is subjected the element 21 along the axis Y, during an oscillation. During a following oscillation, the stress to which is subjected the element 21 along the axes X and Y is inverted between the curves C2, C3. The curves C2, C3 have minimum values m1', m1", m2', m2" along the edges of the element 21 and a maximum value M1' near the center of the element 21.

Figure 12A:
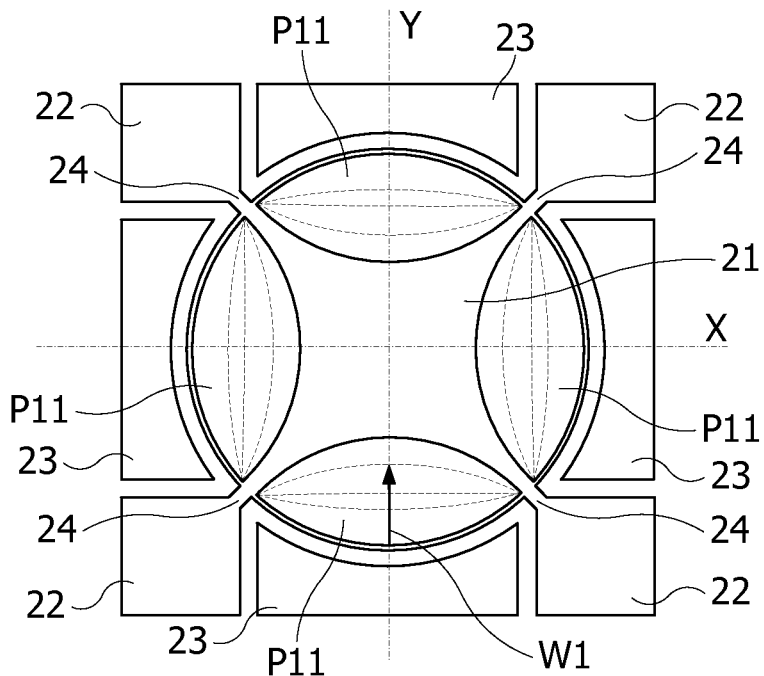
Figure 12B:
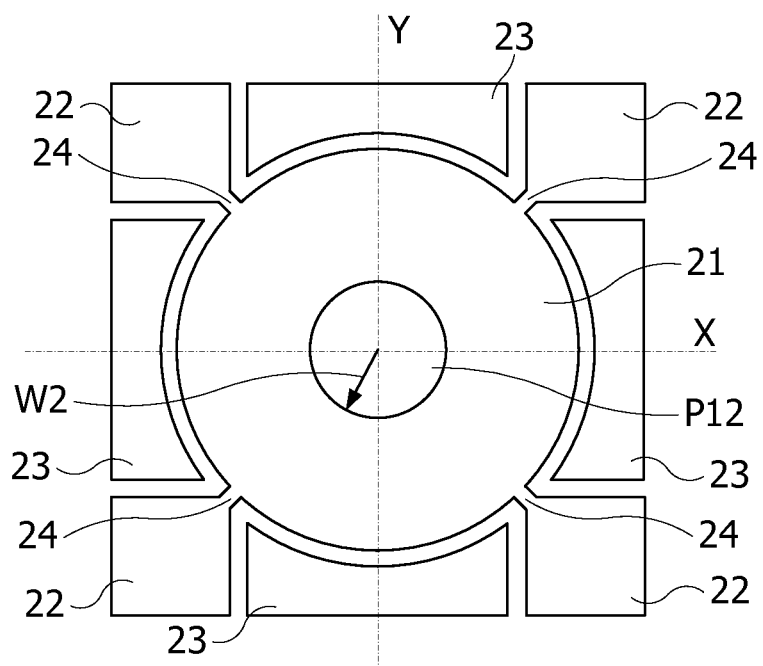

The resonance frequency of such a vibrating element in the shape of a disc may also be adjusted to match a setpoint frequency using patchs arranged on the regions m1', m1", m2', m2" or the region M1'. Thus FIGS. 12A, 12B show vibrating elements which resonance frequency is adjusted using patchs P11, P12. In FIG. 12A, the vibrating element 21 comprises four patchs P11 formed along the edge of the vibrating element, away from the arms 24. In the example of FIG. 12A, each patch P11 has the shape of a spindle, which has a width W1 along the radius of the disc 21. The width W1 of each patch P11 may be adjusted according to the frequency correction to be obtained. Admittedly, to adjust the frequency correction, it is also possible to adjust the length of the patch. The frequency correction obtained by the patchs P11 may be negative if their width W1 is small, or positive when W1 is greater than a particular value.

In FIG. 12B, the resonance frequency of the vibrating element 21 is increased using a patch P12 formed at the center of the disc 21. The frequency correction may be adjusted by modifying the radius W2 of the patch P12 (or its thickness).

The possibilities of correction of the resonance frequency of vibrating elements, such as previously described, are taken advantage of in a method for collectively manufacturing components comprising a vibrating element, such as by implementing photolithography processes on a wafer of semiconductor material. It has been observed that on the semiconductor wafer the distribution of differences between a rated resonance frequency and the resonance frequency of the vibrating elements made on the wafer are substantially invariant from one batch to another. Measuring these differences to determine their distribution on the wafer may therefore be performed once. This distribution is then used to determine the positions and dimensions (lengths, widths, thicknesses, and the like) of patchs to be formed on each of various vibrating elements of the wafer so as to reduce this frequency difference to an acceptable value, for example lower than 5 ppm. These patch positions and dimensions are then used to form a photo-etching mask allowing patchs to be formed at the dimensions and positions wanted on each of the vibrating elements in which resonance frequency is to be corrected.

In one embodiment, the patchs may be formed by depositing a layer of the material chosen on the whole surface of the wafer after forming the vibrating elements, then etching the layer deposited by a photolithography process so as to leave only the patchs at wanted dimensions and locations of the wafer. The layer forming the patchs may be deposited using various known means. In some embodiments, the thickness of the layer deposited in which the patchs are formed is precisely controlled. Thus, the layer forming the patchs may be made by atomic layer deposition (ALD), physical vapor deposition (PVD), epitaxy if the layer forming the patchs is made of silicon, oxidation if the layer forming the patchs is made of silicon oxide, and the like.

The positions and dimensions of the patchs to be formed according to the resonance frequency difference to be corrected may be determined using an abacus, such as that of FIG. 8, which are constituted from series of measurements taken on the vibrating element on which patchs of various dimensions are formed. The positions and dimensions of the patchs to be formed may also be determined with analytical or Finite element models.

Figure 13A:
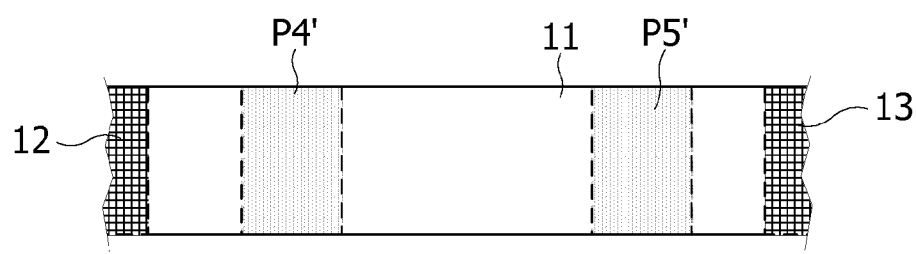
FIG. 13A shows in top view a vibrating element, according to one embodiment.
Figure 13B:
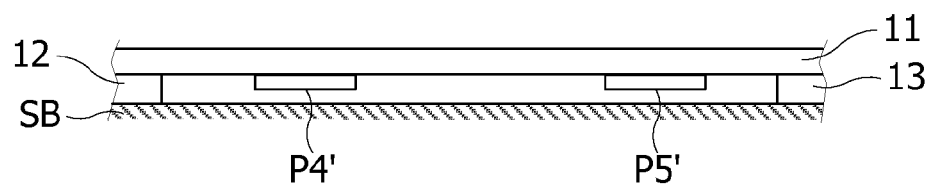
FIG. 13B shows in side view the vibrating element of FIG. 13A.

It is to be noted that the patchs may be formed below the layer forming the vibrating elements, i.e., by depositing a first layer onto the sacrificial layer, etching the first layer to form the patchs, then by depositing the second layer on the patch and etching the second layer to form the vibrating elements. In FIGS. 13A, 13B, patchs P4', P5' are arranged below the vibrating element 11.

If the patchs are made of the same material as that forming the vibrating elements, they may also be made by increasing the layer forming the vibrating elements by the thickness of the patchs, and removing a superficial layer having the thickness of the patchs at the locations without patchs.

It will be clear to those skilled in the art that the present disclosure is susceptible to various other embodiments and applications. In particular, the disclosure is not limited to the vibrating elements previously described, but may apply to all the vibrating elements susceptible of being integrated on a wafer in a material such as semi-conductor, ceramics, glass or quartz. Furthermore, the disclosure is not limited to electrostatically actuated and capacitive motion detection vibrating elements. The disclosure may apply to actuated micro-machined vibrating elements, or to vibrating elements whose movements are detected by other means, such as by piezoelectric, piezoresistive or magnetic effect.

Admittedly, the resonance frequency of the vibrating elements may be modified simply by forming in or on the vibrating element one or more areas of modified thicknesses, being understood that an area of modified thickness may also be a perforation going through the vibrating element.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of adjusting a resonance frequency of a vibrating element, the method comprising:
   measuring a first resonance frequency of the vibrating element;
   comparing the first resonance frequency to a reference frequency;
   determining one or more regions of at least one of low stress and of high stress on the vibrating element;
   determining a dimension and a position of an area of modified thickness to be formed on the vibrating element to cause the vibrating element to resonate at a second resonant frequency that substantially corresponds to the reference frequency, wherein the determined dimension and position of the area of modified thickness is a function of the first resonance frequency, the reference frequency, and the one or more regions, and
   forming the area of modified thickness on the vibrating element at the determined dimension and position.

2. The method according to claim 1, wherein forming the area of modified thickness includes forming a patch on the vibrating element.

3. The method according to claim 2, wherein forming the patch on the vibrating element comprises adding a layer of material on the vibrating element, and wherein forming the area of modified thickness further includes removing a portion of the layer of material that is located outside an area where the patch is to be formed.

4. The method according to claim 1, wherein the area of modified thickness is configured to cause the second resonance frequency to be less than or equal to 5 parts per million of the reference frequency.

5. The method according to claim 1, wherein determining one or more regions comprises determining two regions of low stress on the vibrating element.

6. The method according to claim 2, wherein determining one or more regions comprises determining two regions of high stress on the vibrating element.

7. The method according to claim 2, wherein the second resonance frequency of the vibrating element is adjusted to a value lower or higher than the first resonance frequency by selecting a patch width and by forming a patch having the selected width on the vibrating element on each of two areas where the stress to which the vibrating element in resonance is subjected is minimum.

8. The method according to claim 1, wherein determining a dimension and a position of an area of modified thickness to be formed on the vibrating element comprises:
   forming a plurality of second vibrating elements having the reference resonance frequency and dimensions of the vibrating element;
   forming an area of modified thicknesses on each of the second vibrating elements, the areas of modified thickness having different dimensions and thicknesses;
   measuring the resonance frequency of each of the second vibrating elements with the area of modified thickness; and
   using the measured resonance frequencies and the dimension and position of the areas of modified thickness to determine a dimension and position of an area of modified thickness to be formed on the vibrating element.

9. A method comprising:
   forming vibrating elements on a first wafer;
   measuring a first resonance frequency of each of the vibrating elements on the first wafer;
   comparing the first resonance frequency of each of the vibrating elements to a reference frequency;
   determining a dimension and a position of an area of modified thickness to be formed on one or more of the vibrating elements that is configured to cause the respective vibrating elements to resonate at a second resonance frequency, wherein the second resonance frequency substantially corresponds to the reference frequency, and wherein the determined dimension and position of the area of modified thickness is a function of the first resonance frequency of one or more vibrating elements on the first wafer and the reference frequency; and
   forming the area of modified thickness of one or more vibrating elements on a second wafer at the respective determined dimension and position.

10. The method according to claim 9, wherein the area of modified thicknesses are formed on the second wafer before the one or more vibrating elements are formed on the second wafer.

11. The method according to claim 9, wherein a photo etching mask is used to form the area of modified thickness having the determined dimension and position on one or more of the vibrating elements.

12. The method according to claim 9, wherein the area of modified thickness is formed on a plurality of vibrating elements, and wherein the dimension and position of the dimension and position of the area of modified thickness is different for at least two vibrating elements.

13. A wafer comprising:
   a substrate;
   first and second anchors; and
   a first vibrating element and a second vibrating element formed over the substrate, the first vibrating element coupled to the substrate by the first anchor and the second vibrating element coupled to the substrate by the second anchor, the first vibrating element having a first thickness at a first position that is located a first distance from the first anchor, the second vibrating element having a second thickness at a second position that is located a second distance from the second anchor, wherein the first distance is substantially the same as the second distance, and wherein the first thickness is different from the second thickness.

14. The wafer according to claim 13, wherein one of the first vibrating element and the second vibrating element has a patch formed at the respective first and second position, and wherein the patch comprises a material chosen from a group consisting of silicon, silicon oxide, silicon nitride, chromium and gold.

15. The wafer according to claim 13, wherein the vibrating elements have the shape of a beam or a plate maintained between two ends, or a disc maintained at the periphery thereof by four points.

16. The wafer according to claim 14, wherein the patch is formed on a surface of one of the first vibrating element and the second vibrating element.

17. The wafer according to claim 13, wherein the first thickness extends across the first vibrating element.

18. A wafer comprising:
   a substrate; and
   a first vibrating element and a second vibrating element formed over the substrate, each of the first and second vibrating elements having a patch formed on one area where a stress of the respective vibrating element in resonance is minimum, wherein the patch formed on the first vibrating element has a first thickness and a first width, and the patch formed on the second vibrating element has a second thickness and a second width, and wherein the first and second thicknesses are the same, and the first width is different from the second width.

19. A wafer comprising:
   a substrate; and
   a first vibrating element and a second vibrating element formed over the first substrate, each of the first and second vibrating elements having two patchs formed respectively on two areas where a stress of the vibrating element in resonance is minimum, wherein the patchs formed on the first vibrating element have a first thickness and a first width, and the patchs formed on the second vibrating element have a second thickness and a second width, and wherein the first and second thicknesses are the same, and the first width is different from the second width.

20. The wafer according to claim 18 wherein the first vibrating element and the second vibrating element have respective longitudinal lengths, the patches are formed of the respective first and second vibrating elements at substantially a same location along the longitudinal lengths.

21. The wafer according to claim 19 wherein of each the patches are formed on an upper surface of the first and second vibrating elements.

* * * * *